(12) United States Patent (10) Patent No.: US 8,136,078 B2
Nackaerts et al. (45) Date of Patent: Mar. 13, 2012

(54) OPTIMIZATION

(75) Inventors: Axel Nackaerts, Haasrode (BE);
Gustaaf Verhaegen, Putte (BE); Paul Marchal, Blanden (BE)

(73) Assignee: IMEC, Lucerne (CH)

( * ) Notice: Subject to any disclaimer, the term of this patent is extended or adjusted under 35 U.S.C. 154(b) by 511 days.

(21) Appl. No.: 12/258,261

(22) Filed: Oct. 24, 2008

(65) Prior Publication Data
US 2009/0112344 A1 Apr. 30, 2009

(30) Foreign Application Priority Data
Oct. 26, 2007 (EP) ..................... 07119381

(51) Int. Cl.
*G06F 17/50* (2006.01)
(52) U.S. Cl. ........... 716/132; 716/55; 716/105; 716/126
(58) Field of Classification Search .................... 716/55, 716/105, 126, 132
See application file for complete search history.

(56) References Cited

U.S. PATENT DOCUMENTS
7,383,521 B2 * 6/2008 Smith et al. ................... 716/114
* cited by examiner

*Primary Examiner* — Thuan Do
(74) *Attorney, Agent, or Firm* — Knobbe Martens Olson & Bear LLP

(57) ABSTRACT

A method for optimizing a design for a device is disclosed. Such an optimization is performed with respect to a predetermined metric, e.g. device speed, area, power consumption or yield. In one aspect, the method comprises obtaining a design for a device. The design comprises design components. The method also comprises determining from the design components at least one group of first design components that has a higher sensitivity to the predetermined metric than second design components. The first design components may be on the critical path in the design. The method further comprises tuning the first design components and the technology for manufacturing the first design components thus reducing the variability of the first design components and obtaining an optimized design with respect to the predetermined metric.

16 Claims, 7 Drawing Sheets

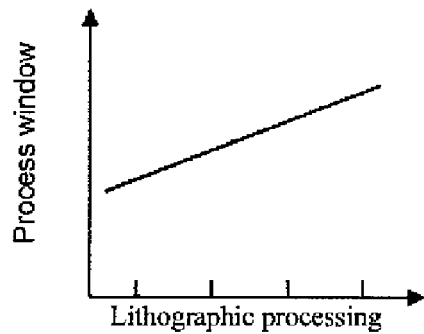
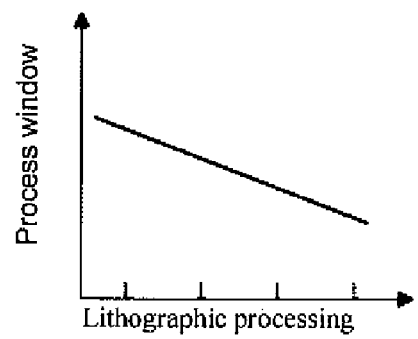
Fig. 4a  Fig. 4b
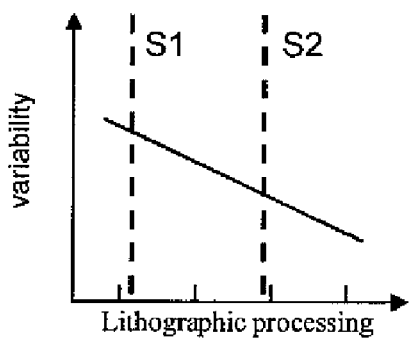
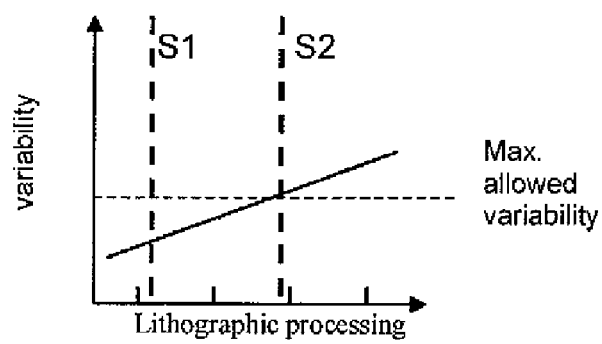
Fig. 4c  Fig. 4d

OPTIMIZATION

BACKGROUND OF THE INVENTION

1. Field of the Invention

The present invention relates to the field of design for manufacturing techniques of devices and process optimization in general. More particularly, the present invention relates to methods and systems for designing devices such as for example integrated circuits and/or electronic circuits and corresponding manufacturing techniques.

2. Description of the Related Technology

Devices, such as integrated circuits and/or electronic circuits, for today's applications need to operate fast, be small and be low power consuming. Often a trade-off between the device speed, the area used and the power consumption is to be made. These metrics put a high burden on the devices that can be used and on their corresponding manufacturing techniques, especially as in view of economic cost the production of such devices needs to have a high production yield. The production yield thereby is specified as the ratio of work to be done to the number of good devices that are produced.

In current manufacturing design applications, the manufacturing technology to be used is fixed first, thus determining the design rules imposed on the designer, leaving only some remaining technology options open. Assuming the fixed manufacturing technology, the designer tunes the device to be obtained to an optimum with respect to the manufacturing yield and area, performance and power metrics after processing based on design component information available from libraries and using the remaining technology options selectable from an available set.

An alternative way to increase yield in device manufacturing that has been exploited is the improvement of the overall variability for the whole library, resulting in a huge optimization process of the library. Reducing the overall variability for the whole library and thus limiting the variability of the constituting subsystems may result in over-design, making the design more sensitive to other sources of yield loss. The overall reduction of variability of the library furthermore is labor-intensive and often implies a trade of between power and yield.

One technique that is often used for guaranteeing that requirements on a given metric, e.g. device speed, are reached by selecting the design components too fast so that it still is fast enough if some of the device components are a bit too slow due to a variation during the manufacturing process of the device components. The latter unfortunately results in a larger power or area consumption for the device. Furthermore, over-design also may result in a reduction of the overall production throughput.

A further technique often used is design for manufacturability (DFM), which is a design methodology using a set of techniques to modify the design of integrated circuits in order to improve e.g. the functional yield, the parametric yield, the reliability, etc. With design for manufacturability techniques, the most critical regions are analyzed and the design is locally changed for increasing the yield. Such techniques include substituting higher yield cells where permitted by timing, power and routability, changing the spacing and width of the interconnect wires where possible, optimizing the amount of redundancy in internal memories, substituting fault tolerant vias in a design where possible, etc.

Although a number of supporting methods have been provided for supporting system design technology, systematic methodologies and appropriate supporting design tools still are required for obtaining a good trade off between design time, economical cost and efficiency of the system.

SUMMARY OF CERTAIN INVENTIVE ASPECTS

Certain inventive aspects relate to apparatus or methods for optimizing design or manufacturing processes for a device as well as to provide good designs or manufactured devices thus obtained. One aspect relates to integrated design and manufacturing processes for devices and systems. Another aspect relates to systems and methods resulting in a good, e.g. improved, yield and throughput. Another aspect relates to systematic and integrated methods for optimizing design or manufacturing processes for devices are provided. The design methods for devices can be co-optimized using a wide range of parameters, thus resulting in more efficient or appropriate corresponding devices, while not incurring a significant cost penalty. Co-optimization can be obtained using a wide range of parameters both on manufacturing level as on the design level. The optimization is not limited to the lay-out level, but also raises up to the design level e.g. includes altering the design rules, i.e. the design components that can be used, by tuning the manufacturing technology or settings for manufacturing. Such an optimization may be done for any desired metric, such as for example for device speed, power consumption, area consumption, e.g. foot print, or yield. Methods and systems are provided that allow to deal with and/or take into account variability induced by the processes used during manufacturing, thus being able to reduce the variability in the devices and resulting in a higher yield.

One inventive aspect relates to a method for optimizing a design of a device with respect to a predetermined metric, the method comprising obtaining a design for a given device, the design comprising a plurality of design components, determining from the plurality of design components at least one group of first design components influencing the predetermined metric, characterized in that the method comprises tuning at least the first design components and tuning the manufacturing technology and/or settings for manufacturing the first design components thus reducing the variability of the first design components so as to obtain an optimized design with respect to the predetermined metric. More efficient designs for manufacturing processes can be obtained, e.g. having a higher throughput, having a higher yield or having a lower power consumption.

The tuned manufacturing technology may be lithographic processing. A lot of degrees of freedom can be available in the lithographic processing, therefore allowing a wide range of tunability.

An obtained variability of the first design components may depend on the tuned manufacturing technology. The variability thereby may be defined as the variation of properties of the obtained device, e.g. design component, occurring when the processing of the design component varies over the process window obtained using the manufacturing technology. The considered variability may be variability of the obtained components that influence the predetermined metric. An additional degree of freedom can be used for optimizing the design for manufacturing the device. The optimization includes optimization at the level of the selection of the design components as function of their manufacturing and not only optimization at the lay-out, e.g. selection of design components in view of optimizing the lay-out.

Tuning at least the first design components and tuning the manufacturing technology and/or settings for manufacturing the first design components may imply varying design rules for the design.

The obtained variability may depend on a process window obtained for a used manufacturing technology.

Tuning the manufacturing technology may comprise increasing the process window for the manufacturing technology of the first design components.

Determining from the plurality of design components may comprise partitioning the plurality of design components in at least one group of first design components and at least one group of second design components, the first design components putting a larger burden on the predetermined metric than the second design components.

Partitioning the plurality of design components may comprise evaluating whether the design components place more than a predetermined burden on the predetermined metric or not, and identifying design components placing a larger burden on the predetermined metric as first design components while identifying components not placing a larger burden on the predetermined metric as second design components.

Tuning furthermore may comprise taking into account the effects on the second design components. A higher priority may be given to the tuning of the first design components than to the tuning of the second design components.

The method furthermore may comprise, if the effect of the tuning on the second design components is that at least one of the second design components places a larger burden on the predetermined metric than the predetermined criterion, identifying the at least one of the second design components as first design component and repeating the tuning.

The method furthermore may comprise, if the effect of the tuning on the second design components is that at least one of the second design components places a larger burden on the predetermined metric than the predetermined criterion, halting the tuning.

Influencing the predetermined metric may correspond with being on a critical path of the design.

Optimizing the design with respect to the predetermined metric by tuning the design and the manufacturing process may comprise selecting components from a library providing design component information combined with manufacturing technology information for the manufacturing of the design component.

Tuning the lithographic processing may comprise selecting any or a combination of an illumination type, an exposure time, an exposure dose, an applied numerical aperture, a coherency factor, a mask type or focus conditions, a resist composition, a soft bake, a thickness of oxide layers or a deposition technique.

The predetermined metric is any of a device speed, an area consumed by the circuit, a yield or power consumption. The device speed thereby may be clock speed of the device.

The optimization may comprise combined tuning of the design components and the manufacturing technology.

Another inventive aspect relates to a library of design components, the library comprising for each design component, combined information regarding the design component and its manufacturing technology characteristics. The information regarding manufacturing technology characteristics may be information regarding a correlation between the manufacturing technology characteristics and a variability of the component or a correlation with the predetermined metric Another inventive aspect relates to a computing system programmed for performing a method for optimizing a design as described above, and furthermore relates to a computer program product for executing the method for optimizing a design as described above. Another inventive aspect also relates to a machine readable data storage device storing such a computer program product and/or the transmission of such a computer program product over a local or wide area telecommunications network.

In another aspect, a globally higher yield can be obtained.

Manufacturing process, such as e.g. lithography, library design and logic/physical synthesis can be co-optimized, resulting in improved global yield for the device.

The variability of the critical paths in the device can be reduced without too significantly affecting the non-critical paths.

The design components that strongly influence the optimization metric on the critical path and/or in the region around it may be identified and tackled first.

The optimization can be obtained without severe cost penalty, e.g. in power or area.

Particular and preferred aspects of the invention are set out in the accompanying independent and dependent claims. Features from the dependent claims may be combined with features of the independent claims and with features of other dependent claims as appropriate and not merely as explicitly set out in the claims.

Certain aspects allow the design of improved methods and apparatus for manufacturing devices, such as for example integrated circuits. The above and other characteristics, features and advantages of the present invention will become apparent from the following detailed description, taken in conjunction with the accompanying drawings, which illustrate, by way of example, the principles of the invention. This description is given for the sake of example only, without limiting the scope of the invention. The reference figures quoted below refer to the attached drawings.

BRIEF DESCRIPTION OF THE DRAWINGS

FIG. 4a to FIG. 4d illustrate the variation of the process window as function of lithographic processing conditions for first design components and optional second design components (FIG. 4a respectively FIG. 4b) and the variability as function of lithographic processing conditions for first design components and optional second design components (FIG. 4c respectively FIG. 4d), as can be used in embodiments of the present invention.

Figure 1:
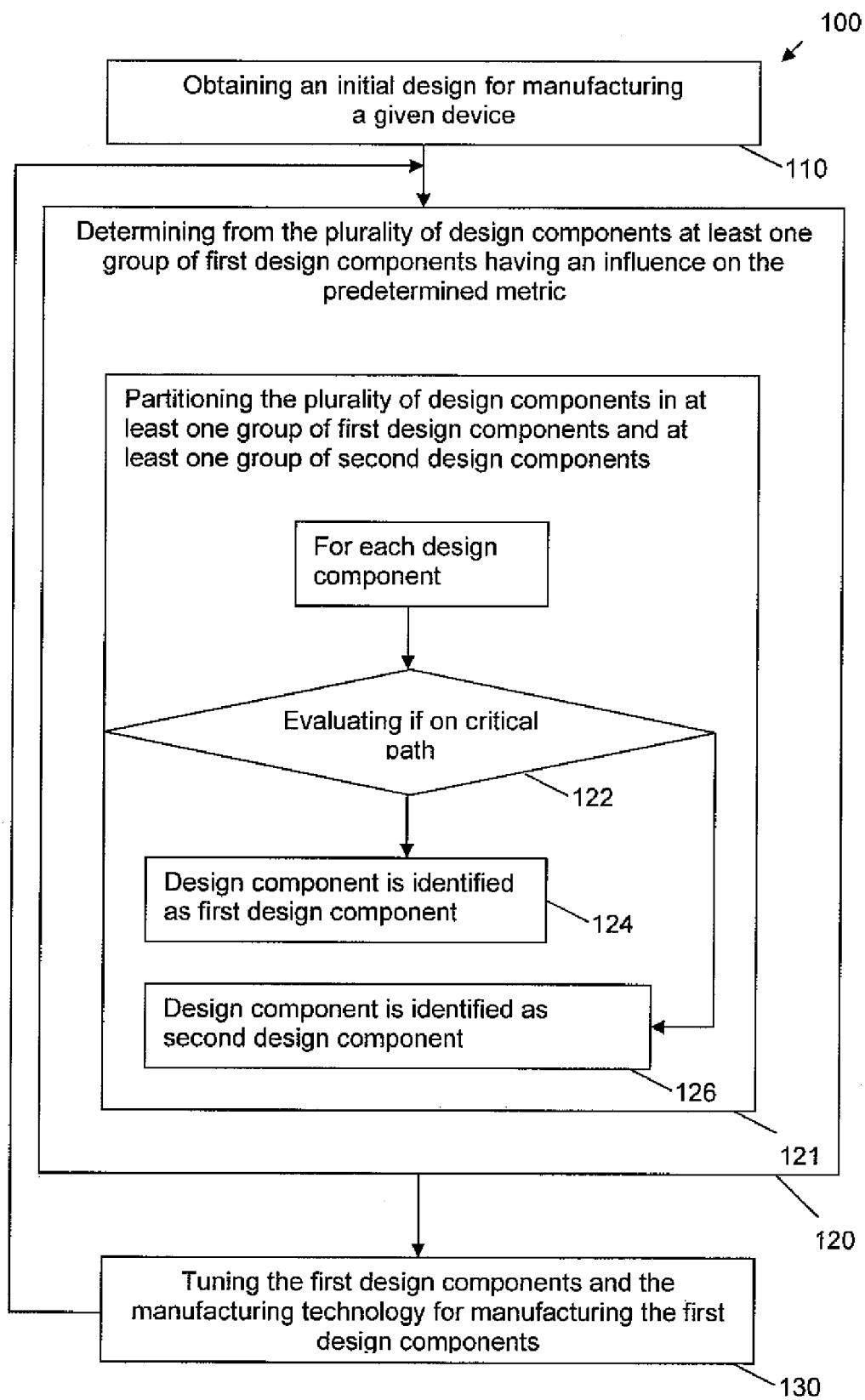
FIG. 1 shows a schematic representation of an exemplary method for optimizing a given design, according to embodiments of the first aspect of the present invention.

In the different figures, the same reference signs refer to the same or analogous elements.

DETAILED DESCRIPTION OF CERTAIN INVENTIVE EMBODIMENTS

The present invention will be described with respect to particular embodiments and with reference to certain drawings but the invention is not limited thereto but only by the claims. The drawings described are only schematic and are non-limiting. In the drawings, the size of some of the elements may be exaggerated and not drawn on scale for illustrative purposes. The dimensions and the relative dimensions do not correspond to actual reductions to practice of the invention.

Furthermore, the terms first, second and the like in the description and in the claims, are used for distinguishing between similar elements and not necessarily for describing a sequence, either temporally, spatially, in ranking or in any other manner. It is to be understood that the terms so used are interchangeable under appropriate circumstances and that the embodiments of the invention described herein are capable of operation in other sequences than described or illustrated herein. It is to be noticed that the term "comprising", used in the claims, should not be interpreted as being restricted to the means listed thereafter; it does not exclude other elements or steps.

Reference throughout this specification to "one embodiment" or "an embodiment" means that a particular feature, structure or characteristic described in connection with the embodiment is included in at least one embodiment of the present invention. Furthermore, the particular features, structures or characteristics may be combined in any suitable manner, as would be apparent to one of ordinary skill in the art from this disclosure, in one or more embodiments. Furthermore, while some embodiments described herein include some but not other features included in other embodiments, combinations of features of different embodiments are meant to be within the scope of the invention, and form different embodiments, as would be understood by those in the art. For example, in the following claims, any of the claimed embodiments can be used in any combination. An element of an apparatus embodiment described herein is an example of a means for carrying out the function performed by the element for the purpose of carrying out the invention.

In the description provided herein, numerous specific details are set forth. However, it is understood that embodiments of the invention may be practiced without these specific details. In other instances, well-known methods, structures and techniques have not been shown in detail in order not to obscure an understanding of this description.

Reference will be made to transistors. These are three-terminal devices having a first main electrode such as a drain, a second main electrode such as a source and a control electrode such as a gate for controlling the flow of electrical charges between the first and second main electrodes.

The following terms are provided solely to aid in the understanding of the description. With "critical path" there is meant the path within a design that dictates the fastest time at which an entire device can run. This path runs from input to output and such that if any activity on the path is delayed, the entire circuit function will be delayed with substantially the same amount of time. In the present application, with "desired metric" there is meant the parameter to which the design is optimized. The latter may for example be device speed, yield or power of the manufactured design.

The invention will now be described by a detailed description of several embodiments of the invention. It is clear that other embodiments of the invention can be configured according to the knowledge of persons skilled in the art, the invention being limited only by the terms of the appended claims.

A first inventive aspect relates to a method for optimizing the design of a device with respect to a predetermined metric. Such a predetermined metric may be the system speed or throughput, i.e. the time the manufactured device needs to perform it's operation, the yield, i.e. the number of devices having the required specifications with respect to the total number of devices manufactured, the total area taken by the device, which may be referred to as the footprint, or the power consumption. The device to be manufactured may for example be an integrated circuit or large logic circuit or alike, the invention not being limited thereto. The method for optimizing the design of a device comprises obtaining an initial design for a given device, the design comprising a plurality of design components. The design components may for example be representative for a functionality to be provided in the device. Such design components may thus be the functional components of a device. Such functional components may be representative of a task to be performed by the device or of a processing component for processing such a task. In one embodiment, the design components may comprise electric components such as for example transistors of a device. The method comprises determining from the plurality of design components, at least one group of first design components influencing the predetermined metric. Such determining may comprise partitioning the plurality of design components in at least one group of first design components and at least one group of second design components, whereby, in embodiments according to the present invention, the partitioning of the components may be performed such that the different groups of components have a different dependency towards the optimization metrics. The first design components thereby may put a higher burden on the predetermined metric than the optional second design components. In particular embodiments, the first design components may be considered to be e.g. on the critical path of the design i.e. be the slowest, to be increasing the power consumption most, to cover the largest area in the device or to providing the largest yield reduction, i.e. being the limiting components in the device. In one embodiment, the first design components and optional second design components may have a different dependency on manufacturing technology features.

The method for optimizing the device further comprises tuning the first design components and tuning a manufacturing technology and/or manufacturing settings used for manufacturing these first design components. In other words, the design components are tuned at the design level, or at the level of the design rules by taking into account manufacturing technology or settings for the first design components. The method according to embodiments of the present invention therefore influences the design rule level and not only the lay-out level where different design components can be selected as function of the lay-out. In other words, methods according to embodiments of the present invention allow optimization at an earlier stage in the procedure for manufacturing a structure or chip, i.e. performing optimization of the design rules to be applied through optimization of the design components that can be used by taking into account or tuning manufacturing technology and/or settings of the design components. Methods according to embodiments of the present invention thus may influence the design rules to be applied by tuning the manufacturing technology and/or settings of the design components. The manufacturing technology used may comprise lithographic processing, implantation, semiconductor processing steps such as heating, etc. In an advantageous embodiment, the manufacturing technology is lithographic processing. The latter provides a lot of degrees of freedom thereby allowing a wide tunability. Tuning of the manufacturing technology may comprise adjusting or tuning the corresponding process window for the manufacturing processes to be used in order to enhance the manufacturing conditions for the most sensitive or critical design components, optionally at the expenses of process variations occurring in other components. In some embodiments both the first design components and the optional second design components are tuned, the first design components being tuned with a higher priority. As the different design components have a different sensitivity to the processing conditions, the processing conditions can be tuned in favor of the most critical group of components, resulting in an overall optimization of the design.

Figure 2A:
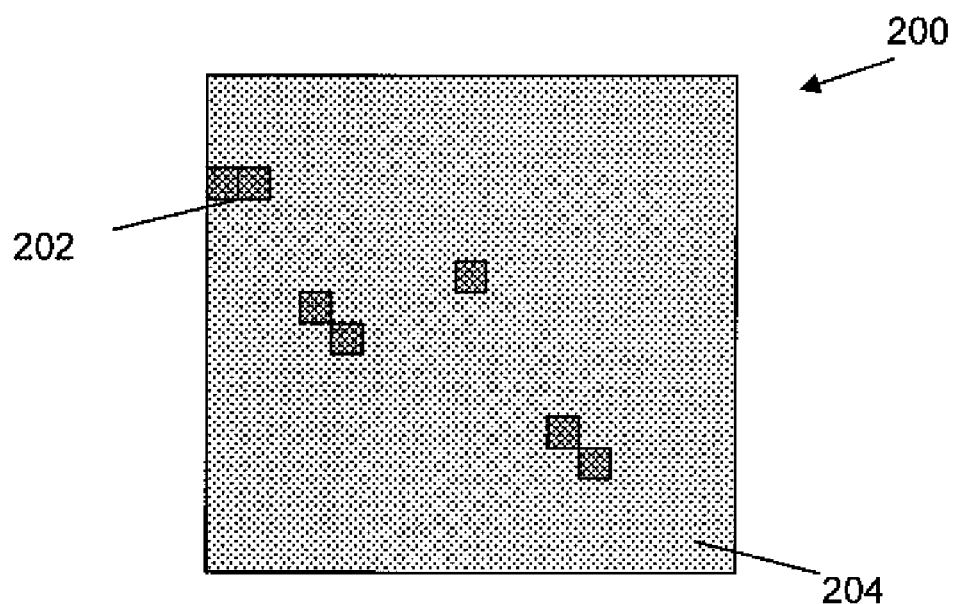
FIG. 2a and FIG. 2b shows a design comprising first design components and optional second design components with respect to a predetermined metric and a corresponding histogram of grouping of design components as used in embodiments of the present invention.

By way of illustration, the embodiment not being limited thereto, different standard and optional process of the method for optimizing a manufacturing process of a device are given with reference to FIG. 1. The method for optimizing a design for manufacturing of a device may be optimized with respect to predetermined metrics, such as for example, with respect to device speed, area consumption, e.g. footprint, power or yield. An example of an initial design 200 with first design components 202 and optional second design components 204 is illustrated in FIG. 2a.

In a first process, the method 100 comprises obtaining 110 an initial design for manufacturing a given device. Obtaining 110 such an initial design may comprise either obtaining a pre-made design for the manufacturing process, or making the design. The latter may be based on conventional design methods, such as e.g. based on initially selected manufacturing techniques implying design rules and selection of components from a library or database based on conventional methods, such as e.g. as function of known functionality of the device components. One way to provide an initial design is to define the design in what is called a higher language, often referred to as register transfer language. On this design written in higher language, synthesis is performed by replacing the function of the design component described in this higher language by a list of components from a cell library which are connected to each other to have the function as described in the higher language. Thereafter, a Place-and-Route process is performed wherein the selected cells and the physical connections defined thereto are designed in the different device layers, e.g. metal layers of the device.

Figure 2B:
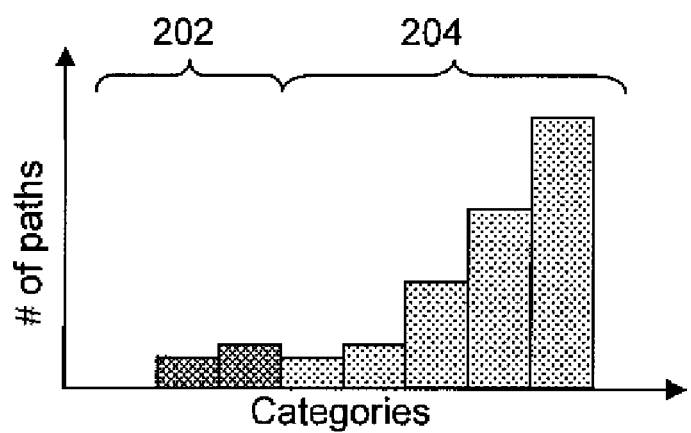
Figure 3A:
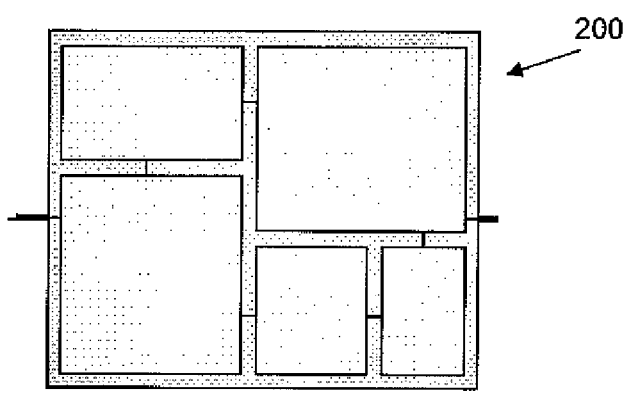
FIG. 3a to FIG. 3c show a design, a design with first and optional second design components partitioned with respect to power consumption and a design with first and optional second design components partitioned with respect to being on the critical path respectively, as can be used in embodiments of the present invention.
Figure 3B:
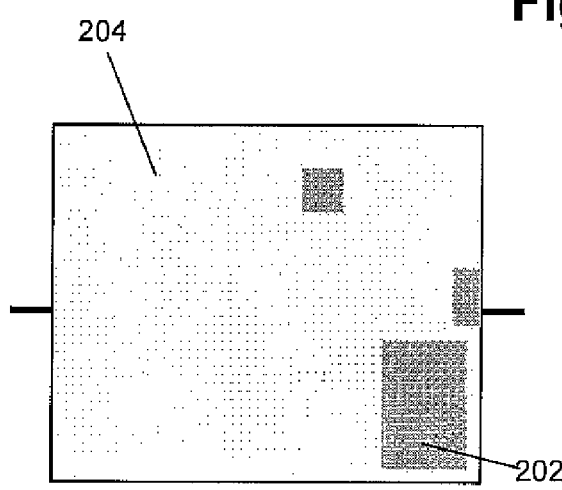
Figure 3C:
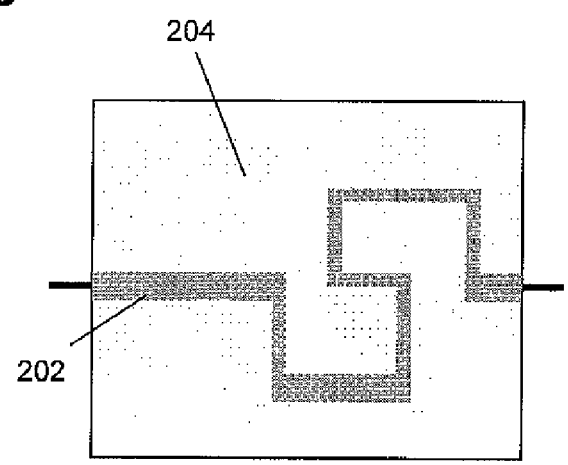

In a second process, the method 100 comprises determining 120 from the plurality of design components at least one group of first design components 202 that has an influence on the metric or metrics for which optimization is to be performed. In one embodiment, the optimization thus is performed keeping only one group of design components in mind. The first design components may, in one embodiment, comprise all design components for the device. In an alternative embodiment, the first design components may only be part of the plurality of design components that eventually will form the design. In alternative embodiments, determining 120 from the plurality of design components at least one group of first design components may comprise partitioning 121 the plurality of design components of the design 200 in at least one group of first design components 202 and at least one group of second design components 204. The at least one group of first design components 202 may be one or more groups, whereby the design components may be further categorized. By way of example, a histogram indicating different categories for first design components 202 and the optional second design components 204 is shown in FIG. 2b for the design 200 of FIG. 2a. The different groups may correspond with different categories of components, whereby the first design components 202 place a larger burden on the predetermined metric for which the design is optimized than the second design components 204. The different categories may be components having a different path slack, the path slack being an indication of the difference between the path and the critical path. If a component has a path slack equal to 0, then the component is considered to be on the critical path. The higher the path slack, the less influence the component has on the metric. By way of illustration, FIG. 3b shows the partitioning of design components for a design 200 as shown in FIG. 3a into first design component 202 requiring more power consumption than the second design components 204, whereas FIG. 3c shows the partitioning of design components for a design 200 as shown in FIG. 3a into first design component 202 resulting in higher device speeds, i.e. being on the critical path, than the second design components 204, i.e. not being on the critical path. In one particular embodiment, partitioning 121 the plurality of design components may comprise the following sequence for each of the design components. For each of the design components it may be evaluated 122 whether or not the design component places a high burden on the predetermined metric, e.g. induces a lot of power consumption, results in a high device speed i.e. being on the critical path, induces a large yield reduction, induces a large area consumption. A high burden on the predetermined metric is induced by those design components that substantially determine the device speed, area consumption, power consumption or yield of the design. It may be the top predetermined percentage of design components when numbered according to decreasing reduction of device speed, area consumption, power consumption or yield or it may be all components inducing a reduction in device speed, an increase in power consumption, an increase in area consumption or a reduction in yield, e.g. above a predetermined level, thus placing the heaviest burden on the process metric for which optimization is performed. Considering whether design components put a high burden on the design metric thus may be performed by making an initial ranking of the design components with respect to their behavior regarding the predetermined metric and then select all design components having a worse behavior than a relative criterion based on the ranking made. Such a relative criterion may for example be belonging to the X % design components having the worst behavior of all design components of the initial design, whereby X % may be any suitable value depending on the processing capacity available for optimizing the design. Alternatively, the design components may be evaluated independent of the other design components and evaluated with respect to their behavior regarding the predetermined metric with reference to a fixed predetermined criterion. E.g. if the design component has a worse behavior than a predetermined criterion regarding the predetermined metric, the design component may be considered to put a high burden, e.g. to be on the critical path. Typical criteria that may be used are "resulting in a device speed below a predetermined value", "having a power consumption above a predetermined value", "having an area consumption above a predetermined value", etc. If the design component is considered as putting a high burden on the predetermined metric, the method proceeds to process 124 where the design component is identified as a first design component 202. In one embodiment, wherein also second design components are identified, design components that are considered not to put a high burden on the device metric, e.g. not be on the critical path, the method proceeds to the optional process 126 where the design component is identified as second design component 204.

After determining the at least first group of design components, the method continues to process 130, wherein the first design components 202 and the manufacturing technology and/or settings for manufacturing the first design components are tuned in order to obtain an optimized design. In some embodiments all design components may be tuned in combination with the manufacturing technology. In the optional case at least two sets of design components are determined, a higher priority or weight is given to the first design components 202 than to the second design components 204.

Tuning of the first design components 202 thus is performed together with the tuning of the manufacturing technology, thus allowing selection of a different or adjusted manufacturing technology for optimizing the design. The latter is in contrast with the selection of a library at the start of the design process and the mere use of such library which is implying its design rules to the designer. Tuning the manufacturing technology may comprise tuning between significantly distinct technologies such as UV lithographic processing, EUV lithographic processing, immersion lithographic processing, annealing, implanting, etching, etc, but also tuning with respect to manufacturing technology system parameters used, such as for example for lithographic processing tuning of any or a combination of type of illumination, doses of illumination used, exposure time of the illumination used, mask type used, mask features used, applied numerical aperture, coherency factor for the radiation used, focus conditions used etc. By co-tuning the design, i.e. at least the first design components 202 and the manufacturing technology, the additional degrees of freedom obtained by using tuning of manufacturing technology may result in an overall improved method for manufacturing the design or a manufacturing process that produces devices with a better characteristic for the circuit. In embodiments according to the present invention, such a co-optimization thus may imply that the design rules may be tuned as co-optimizing the design components and their manufacturing technology or settings may imply that different design components are introduced, rather than sticking to a predetermined library selected based on predetermined manufacturing technology. In embodiments of the present invention, co-optimization can be considered to result in changes of the design components in the group of components from which one can choose due to a variation in the design rules, as the design components available can be varied by tuning the manufacturing technology or settings used. The latter is indicated by the arrow at the left hand side of FIG. 1, indicating the influence on the design components in the library, i.e. on the design rules. The tuning may be performed until a predetermined level for the metric is reached. Such a predetermined level may be when a predetermined value for the metric is obtained, when the rate of improvement upon tuning is smaller than a predetermined value, etc. In one embodiment, the method can be performed in an automated and/or automatic way. The method may be a computer based method, steps or each step of the method may be performed by a computer device, as will be described in more detail below.

Further features and advantages of embodiments of the present invention will become apparent from the following particular embodiments.

In a first particular embodiment of the present invention, tuning the design components together with their manufacturing technology may comprise selecting design components from a library comprising both information regarding the design component and regarding its manufacturing technique. It may for example comprise information regarding the properties of the design component as function of the manufacturing technique selected or as function of the manufacturing technique characteristics. In one example, such information may comprise process conditions such as for example evolution of a process window for the manufacturing of the design component as function of the manufacturing techniques. Co-tuning of the design components and the manufacturing technique then may comprise tuning the manufacturing technique for the selected design components so as to increase the process window for the manufacturing of the first design component 202 as this reduces variation in the properties of the first design components and consequently reduces the burden on the predetermined metric for the specific component. In another example, such process information may be directly incorporated as information on the effect of variability of the design component as function of the manufacturing conditions of the design component used.

In a second particular embodiment, obtaining an optimized design may be performed by tuning both the manufacturing technology of the first design components 202 and the optional second design components 204 such that for first design components 202 improved behavior with respect to the metric is found, reducing the variability on the first design components 202 in the device. Again such a reduction of variability on the first design components 202 results in better first design components, and as these put the highest burden on the predetermined metric this results in an optimized design for the predetermined metric. The variability thereby may be variation in the behavior of the design component with respect to the predetermined metric, which may, amongst others, be caused by variation induced by variations of the manufacturing technology in the process window. If the variability is reduced, the overall performance of the design for manufacturing is thus improved. Nevertheless, according to the present embodiment, the optional second design components 204 are also taken into account, albeit with a reduced priority or weight. The latter is advantageous as reducing the variability of the first design components 202 by tuning the manufacturing technology, the variability of the second design components 204 may be increased, because the latter also may be dependent on the manufacturing technology. An increase of the variability of the second design components may not significantly influence the overall design or device performance as these second design components may have a significant smaller impact on the predetermined metric. According to an example of the present embodiment, the variability of the second design component 204 may be checked or monitored and if the variability of the optional second design components 204 becomes too high, either part of the tuning may be undone or the tuning may be continued, taking the second design components with a too high variability into account as first design components. In an advantageous embodiment, during the tuning, a check is made on the variability of the second design components in order to see, whether the tuning of the manufacturing device has not induced a second design component to become critical. In other words, as changes in the variability due to tuning of the manufacturing technology, e.g. lithographic processing, may move paths from non-critical to critical, i.e. may shift design components on the critical path, or may shift the burden on the predetermined metric from low to high, these design components are also to be considered with higher priority in the optimization. The second design component in question then is identified as first design component and the tuning process is performed again. Such a check may be performed at regular intervals or substantially continuously. By way of illustration, the influence of manufacturing technology such as e.g. lithographic processing conditions on the process window for first design components and second design components and on their corresponding variability is shown in FIG. 4a to FIG. 4d. FIG. 4a and FIG. 4b indicate the process window as function of the manufacturing technology, in the present example being lithographic processing conditions used, on first design components 202 respectively second design components 204 whereas FIG. 4c and FIG. 4d indicate the corresponding variability for first design components 202 and second design components 204. It can be seen that for a given level of allowed variability of the second design components 204, tuning of the manufacturing technology conditions may be performed allowing decreasing the variability of the first design components 202 while increasing the variability of the second design components 204. The latter may nevertheless be controlled so that the variability obtained for the second design components 204 does not raise above a predetermined level. The latter is illustrated by a shift in manufacturing technology conditions from a first set S1 to a second set S2. FIG. 4a to FIG. 4d inherently indicate that identical designs may have a different response with different litho conditions over the process window.

By way of illustration, the embodiment not being limited thereto, a number of experimental results and examples will be discussed in more detail, illustrating some features and advantages of the embodiments of the present invention.

Figure 5A:
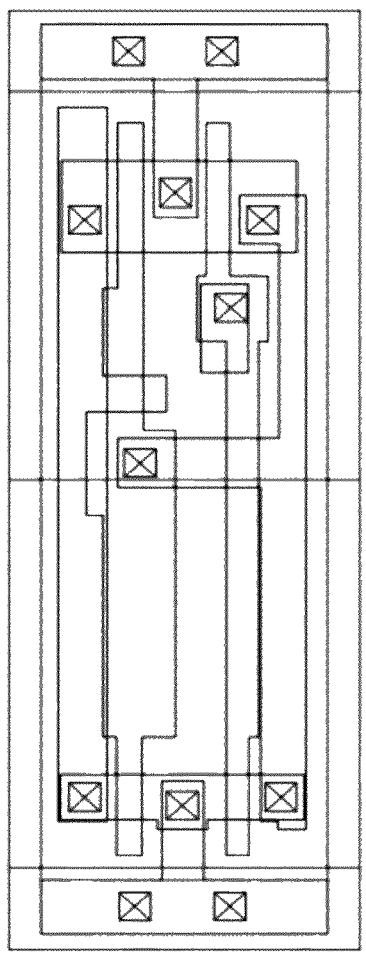
FIG. 5a and FIG. 5b illustrate two design components having the same functionality but having a different lay-out, the lay-out in FIG. 5b being more litho friendly, as can be used in embodiments according to the present invention.
Figure 5B:
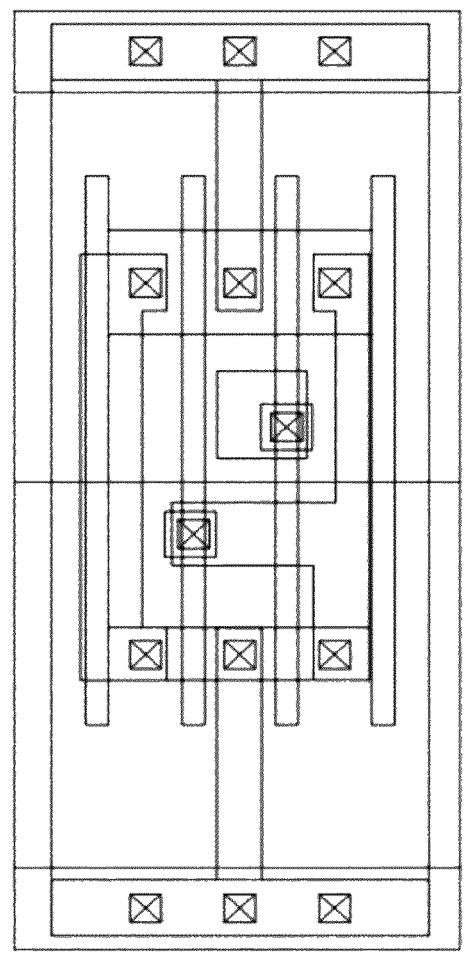

In a first particular example, two different electric components are shown providing the same functionality, wherein the lithographic lay-out differs. The latter, shown in FIG. 5a and FIG. 5b, is an illustration of the possibility of changing manufacturing technology relates aspects in order to optimize the design. FIG. 5b thereby indicates a more lithographic processing friendly process than FIG. 5a.

Figures 6A, 6B:
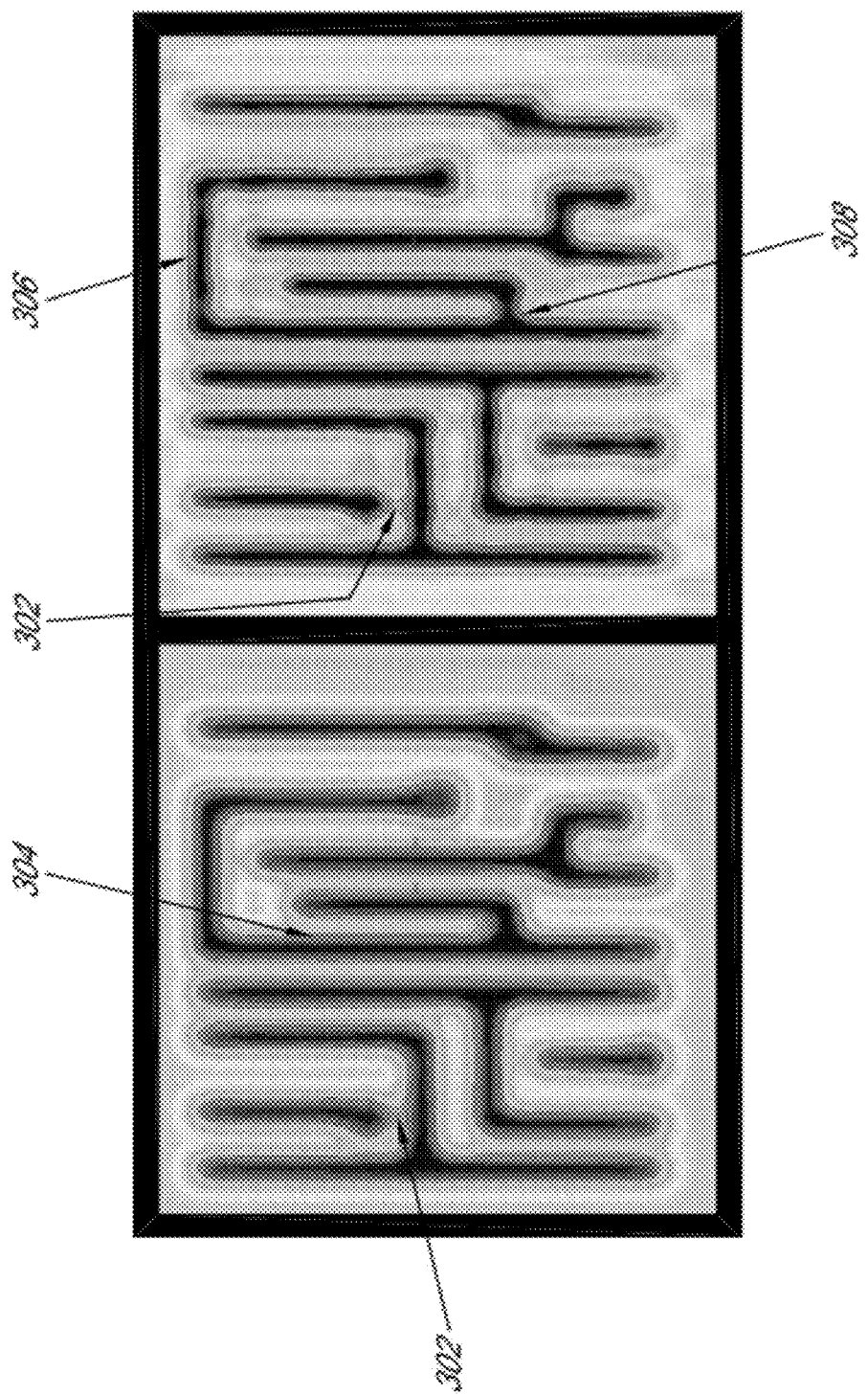
FIG. 6a and FIG. 6b illustrate two examples of a design component manufactured with different litho settings resulting in different design features in the design component, as can be used in embodiments according to the present invention.

In a second particular example, experimental results are shown for the manufacturing of an electric component using two different illumination conditions during the lithographic processing. In FIG. 6a an illustration is given of the manufactured component using conventional on-axis illumination for the lithographic processing used, whereas in FIG. 6b an illustration is given of the same manufactured component using a quadrupole illumination. Different effects on bridging 302, widening 304, rippling 306 and corner formation 308 can be seen. The latter illustrates that depending on the design component and the effects occurring therein, sometimes one type of illumination setting will be advantageous while at other times another type of illumination setting may be advantageous. It thus illustrates that optimizing or tuning the manufacturing technology in combination with the design may result in advantageous components and consequently in advantageous overall designs and corresponding devices.

In a third particular example, the method for optimizing design for manufacturing of a large logic circuit is illustrated. After gate-level logic synthesis, the logic paths are subdivided in critical paths and non-critical paths, and allowable variability limits are set on each. During physical synthesis, different types of standard cells are used for the two classes of paths. The critical paths use regular (more "litho-friendly") cells, with less variability but larger area, while the non-critical paths use compact, non-regular cells. The variability of the critical paths is then determined. If the variability is too high, the litho conditions are changed to increase the process window and decrease the variability of the regular cells. This however also affects the non-regular cells, increasing the variability of the non-critical paths. If the variability of the non-critical paths exceeds a pre-determined level, two paths can be chosen: either the non-critical path is promoted to critical path and replaced by regular cells, at the cost of area and power, or it is considered that the optimum point is reached, where the variability of critical and non-critical paths are balanced. This example illustrates that the litho conditions for logic paths on the critical path thereby are enhanced at the expense of process variations on other sets. An illustration of the present example may be that the litho-conditions for the transistors on the critical path are enhanced at the expense of process variations on other sets.

A second inventive aspect relates to a library of design components. Such a library comprises a plurality of design components whereby for each design component, a description of design component features is provided. The description comprises both information regarding the design component and regarding its manufacturing technology conditions and/or manufacturing settings. These manufacturing technology conditions and/or manufacturing settings can be used, e.g. for taking them into account during design. Such manufacturing technology information may be information regarding a correlation between the manufacturing technology characteristics and a variability of the component or a correlation with the predetermined metric. It may for example comprise information regarding the properties of the design component as function of the manufacturing technology characteristics. In one example, the manufacturing technology information may be information regarding a manufacturing technology process window. Such a library may be stored in any suitable way such as e.g. on a computer hardware memory or on a carrier medium. The library may be accessible by a design optimization program.

A third inventive aspect relates to a design for a device and/or to a corresponding method for manufacturing such a device, wherein the design and method are obtained using a method as described in the first aspect of the present invention. Such a design may result in a device circuit having a high speed, a small footprint, a low power consumption or a combination thereof.

Figure 7:
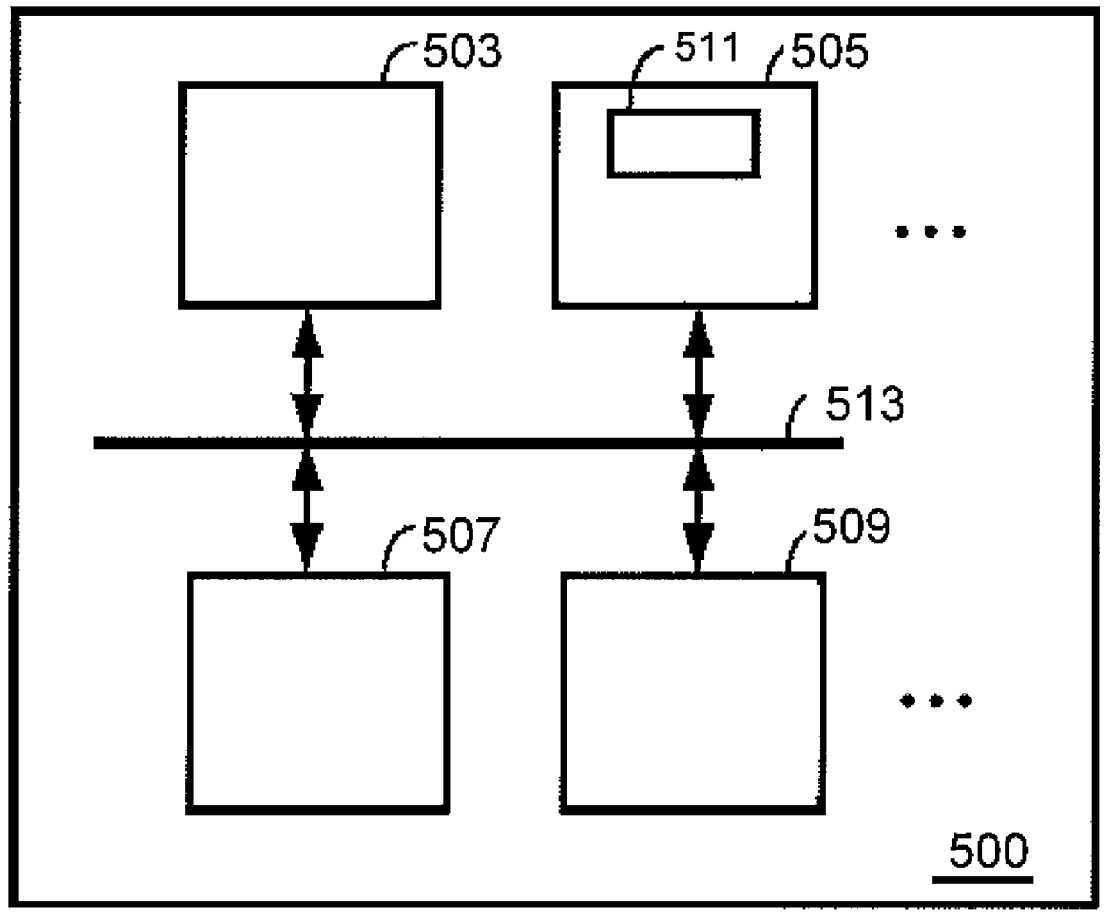
FIG. 7 illustrates a computing device that, when appropriately programmed, performs a method for optimizing according to embodiments of the present invention.

Another inventive aspect relates to processing systems for performing methods for optimizing manufacturing of devices or for optimizing designs of devices as described in the above aspects. Such methods may be completely or partly implemented in a processing system 500 such as shown in FIG. 7. Such a processing system therefore may comprise an obtaining unit configured to obtain an initial design for a given device, a determining unit configured to determine from the plurality of design components at least one group of first design components influencing the predetermined metric. This determining unit may comprise a partitioning unit configured to partition the plurality of design components in first design components and second design components whereby the first design components put a larger burden on the predetermined metric than the second device components. The system may further comprise a tuning unit configured to tune at least the first design components and the manufacturing technology characteristics for manufacturing it. FIG. 7 shows one configuration of processing system 500 that includes at least one programmable processor 503 coupled to a memory subsystem 505 that includes at least one form of memory, e.g. RAM, ROM, and so forth. A storage subsystem 507 may be included that has at least one disk drive and/or CD-ROM drive and/or DVD drive. In some implementations, a display system, a keyboard, and a pointing device may be included as part of a user interface subsystem 509 to provide for a user to manually input information. Ports for inputting and outputting data also may be included. More elements such as network connections, interfaces to various devices, and so forth, may be included, but are not illustrated in FIG. 7. The various elements of the processing system 500 may be coupled in various ways, including via a bus subsystem 513 shown in FIG. 7 for simplicity as a single bus, but will be understood to those in the art to include a system of at least one bus. The memory of the memory subsystem 505 may at some time hold part or all, in either case shown as 511, of a set of instructions that when executed on the processing system 500 implement the step or steps of the method embodiments described herein.

It is to be noted that the processor 503 or processors may be a general purpose, or a special purpose processor, and may be for inclusion in a device, e.g. a chip that has other components that perform other functions. Thus, one or more aspects of the present invention can be implemented in digital electronic circuitry, or in computer hardware, firmware, software, or in combinations of them. Furthermore, aspects of embodiments of the invention can be implemented in a computer program product tangibly embodied in a carrier medium carrying machine-readable code for execution by a programmable processor. Method steps of aspects of the invention may be performed by a programmable processor executing instructions to perform functions of those aspects of the invention, e.g. by operating on input data and generating output data. One embodiment also includes a computer program product which provides the functionality of the method for designing active-medium-based systems or part thereof according to one embodiment when executed on a computing device. Further, one embodiment includes a data carrier such as a CD-ROM, DVD or a diskette which stores the computer product in a machine readable form and which executes at least one of the methods of the foregoing embodiments when executed on a computing device. Nowadays, such software is often offered on the Internet, hence one embodiment includes transmitting the computer product according to the foregoing embodiments over a local or wide area network.

The foregoing description details certain embodiments of the invention. It will be appreciated, however, that no matter how detailed the foregoing appears in text, the invention may be practiced in many ways. It should be noted that the use of particular terminology when describing certain features or aspects of the invention should not be taken to imply that the terminology is being re-defined herein to be restricted to including any specific characteristics of the features or aspects of the invention with which that terminology is associated.

While the above detailed description has shown, described, and pointed out novel features of the invention as applied to various embodiments, it will be understood that various omissions, substitutions, and changes in the form and details of the device or process illustrated may be made by those skilled in the technology without departing from the spirit of the invention. The scope of the invention is indicated by the appended claims rather than by the foregoing description. All changes which come within the meaning and range of equivalency of the claims are to be embraced within their scope.

What is claimed is:

1. A method of optimizing a design of a device with respect to a predetermined metric, the method comprising:
   obtaining a design for a given device, the design comprising a plurality of design components and physical connections between the design components, each design component being a standard cell of a specific function;
   determining from the plurality of design components at least one group of first design components influencing a predetermined metric to which the design is optimized, wherein the process of determining from the plurality of design components comprises partitioning the plurality of design components into at least a group of first design components and a group of second design components, the first design components putting a larger burden on the predetermined metric than the second design components; and
   tuning at least the first design components and tuning the technology and/or settings for manufacturing the first design components thus reducing the variability of the first design components and obtaining an optimized design with respect to the predetermined metric,
   wherein the method is performed by one or more computing devices.

2. The method according to claim 1, wherein the tuned manufacturing technology is lithographic processing.

3. The method according to claim 1, wherein the tuning of at least the first design components and the manufacturing technology and/or settings for manufacturing the first design components comprises varying design rules for the design.

4. The method according to claim 1, wherein the obtained variability depends on a process window obtained for a used manufacturing technology.

5. The method according to claim 4, wherein the tuning of the manufacturing technology comprises increasing the process window for the manufacturing technology of the first design components.

6. The method according to claim 1, wherein the partitioning of the plurality of design components comprises:
   evaluating whether the design components place more than a predetermined burden on the predetermined metric; and
   identifying design components placing a larger burden on the predetermined metric as first design components while identifying components not placing a larger burden on the predetermined metric as second design components.

7. The method according to claim 1, wherein the tuning further comprises taking into account the effects on the second design components.

8. The method according to claim 7, the method further comprises, if the effect of the tuning on the second design components is that at least one of the second design components places a larger burden on the predetermined metric than the predetermined criterion, identifying the at least one of the second design components as first design component and repeating the tuning.

9. The method according to claim 7, wherein the method further comprises, if the effect of the tuning on the second design components is that at least one of the second design components places a larger burden on the predetermined metric than the predetermined criterion, halting the tuning.

10. The method according to claim 1, wherein the influencing of the predetermined metric corresponds with being on a critical path of the design.

11. The method according to claim 1, wherein the optimizing of the design with respect to the predetermined metric by tuning the design and the manufacturing process comprises selecting components from a library providing design component information combined with manufacturing technology information for the manufacturing of the design component.

12. The method according to claim 1, wherein the tuning of the lithographic processing comprises selecting any or a combination of an illumination type, an exposure time, an exposure dose, an applied numerical aperture, a coherency factor, a mask type or focus conditions, a resist composition, a soft bake, a thickness of oxide layers or a deposition technique.

13. The method according to claim 1, wherein the predetermined metric is one of more of a group of device speed, an area consumed by the circuit, a yield or power consumption.

14. The method according to claim 1, wherein the optimization comprises combined tuning of the design components and the manufacturing technology.

15. A computer-readable medium having stored therein a program which, when executed on a computer, performs the method according to claim 1.

16. A system for optimizing a design of a device with respect to a predetermined metric, the system comprising:
  an obtaining unit configured to obtain a design for a given device, the design comprising a plurality of design components and physical connections between the design components, each design component being a standard cell of a specific function;
  a determining unit configured to determine from the plurality of design components at least one group of first design components influencing a predetermined metric to which the design is optimized, wherein the process of determining from the plurality design components comprises partitioning the plurality of design components into at least a group of first design components and a group of second design components, the first design components putting a larger burden on the predetermined metric than the second design components; and
  a tuning unit configured to tune at least the first design components and tuning the technology and/or settings for manufacturing the first design components thus reducing the variability of the first design components and obtaining an optimized design with respect to the predetermined metric.

* * * * *